United States Patent
Kondo et al.

(10) Patent No.: US 7,125,794 B2
(45) Date of Patent: Oct. 24, 2006

(54) METHOD OF MANUFACTURING SEMICONDUCTOR DEVICE

(75) Inventors: Seiichi Kondo, Tsukuba (JP); Kaori Misawa, Tsukuba (JP); Shunichi Tokitoh, Tsukuba (JP); Takashi Nasuno, Tsukuba (JP)

(73) Assignee: Renesas Technology Corp., Tokyo (JP)

( * ) Notice: Subject to any disclaimer, the term of this patent is extended or adjusted under 35 U.S.C. 154(b) by 125 days.

(21) Appl. No.: 10/940,820

(22) Filed: Sep. 15, 2004

(65) Prior Publication Data

US 2005/0064699 A1    Mar. 24, 2005

(30) Foreign Application Priority Data

Sep. 18, 2003    (JP)    ............... 2003-326559
Sep. 18, 2003    (JP)    ............... 2003-326560

(51) Int. Cl.
*H01L 21/4763* (2006.01)
*H01L 21/312* (2006.01)
*H01L 21/469* (2006.01)

(52) U.S. Cl. .............. 438/637; 438/786; 438/624; 438/780; 438/623

(58) Field of Classification Search .............. 438/637, 438/624, 783, 970, 786, 789
See application file for complete search history.

(56) References Cited

U.S. PATENT DOCUMENTS

| 4,944,836 A | 7/1990 | Beyer et al. | |
|---|---|---|---|
| 6,383,913 B1 * | 5/2002 | Tsai et al. | 438/624 |
| 6,440,847 B1 | 8/2002 | Lou | |
| 6,475,929 B1 * | 11/2002 | Gabriel et al. | 438/783 |
| 6,486,059 B1 | 11/2002 | Lee et al. | |
| 6,593,250 B1 | 7/2003 | Higashi | |
| 6,605,545 B1 * | 8/2003 | Wang | 438/717 |
| 2002/0127807 A1 | 9/2002 | Usami | |

FOREIGN PATENT DOCUMENTS

JP    2003-78005    3/2003

OTHER PUBLICATIONS

Simon Lin et al., "Low-k Dielectric Characterization for Damascene Integration", 2001 IEEE, International Interconnect Technology Conference 2001, pp. 146-148.
Annapragada et al., "Low Kintegration Issues for 0.18 uM Devices", Electrochemical Society Proceedings, Electrochemical Society, USA, vol. 98, No. 6, 1999, pp. 178-184.

* cited by examiner

*Primary Examiner*—Chuong Anh Luu
(74) *Attorney, Agent, or Firm*—Leydig, Voit & Mayer, Ltd.

(57) ABSTRACT

A first CVD dielectric layer is deposited on a surface of a semiconductor substrate. Next, low-k layers are deposited in at least two different steps to form one of a via-layer dielectric film and a wiring-layer dielectric film on the first CVD dielectric layer. Immediately after the depositions, thermal treatment is performed. A second CVD dielectric layer is deposited on the low-k layers. A groove is formed in the second CVD dielectric layer and the low-k layers. A metal layer is deposited on that structure, filling the groove. The metal layer is removed from the second CVD dielectric layer by chemical mechanical polishing.

9 Claims, 7 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device in which buried wiring made of Cu or the like is formed in a low-k layer on a semiconductor substrate.

2. Background Art

In recent years, new micro patterning techniques have developed with high integration density and an improvement in capability of a semiconductor integrated circuit (to be referred to as an LSI hereinafter). Chemical-mechanical polishing (to be referred to as CMP hereinafter) is one of the new micro patterning techniques, and is used in LSI manufacturing steps, in particular, planarization of an interlayer dielectric film, formation of a metal plug, and formation of a buried wiring layer in a multi-level wiring (multi-level interconnection) process steps (for example, refer to U.S. Pat. No. 4,944,836).

Recently, in order to improve the capability of an LSI, conventional Al alloy has been replaced by Cu or Cu alloy (referred to generically as Cu hereinafter) as wiring material with low electrical resistance. However, Cu cannot be easily micropatterned by a dry etching method frequently used in fabrication of an Al-alloy wiring layer. Therefore, a Cu layer is deposited on an dielectric layer having a groove formed thereon, and the Cu layer is removed by CMP except for a portion buried in the groove to form a buried wiring layer. That is, a damascene method is mainly employed.

Figure 11:
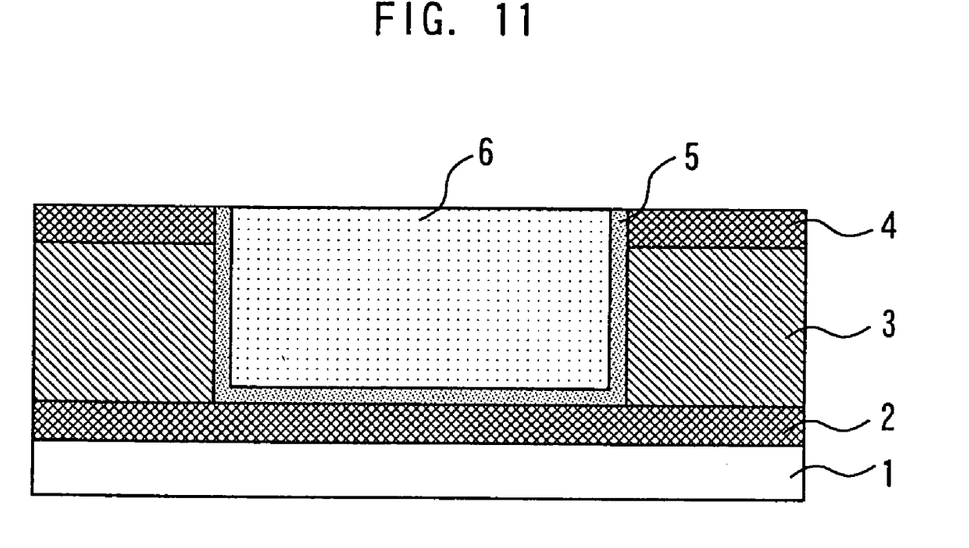
FIG. 11 shows a conventional semiconductor device obtained by combining such a low-k layer or a porous low-k layer and a Cu wiring layer.

In order to reduce parasitic capacitance between wiring layers, an LSI in which, as an interlayer dielectric film, a low-k layer having the dielectric constant of 3.5 or less is used in place of an $SiO_2$ layer having the dielectric constant k of about 4.2 has been practically used. Moreover, low-k materials, that is, low dielectric constant materials, having the dielectric constant of 2.5 or less have been also developed. As these low-k materials, porous materials having pores formed therein are often used. A conventional semiconductor device obtained by combining such a low-k layer or a porous low-k layer and a Cu wiring layer is shown in FIG. 11. A method of manufacturing the semiconductor device will be described below.

An underlying dielectric layer 2 made of a SiC layer is formed on a surface of a semiconductor substrate 1 by CVD method. A low-k layer 3 is formed on the underlying dielectric layer 2. A cap dielectric layer 4 is formed on the low-k layer 3 by CVD method. The cap dielectric layer 4 and the low-k layer 3 are patterned by photolithography and dry etching to form a groove. A barrier metal layer 5 and a Cu layer 6 are formed on the surface of the resultant structure to bury the groove. Finally, the Cu layer 6 and the barrier metal layer 5 on the cap dielectric layer 4 are removed by CMP to form a buried wiring layer in the groove. When a multi-level wiring (multi-level interconnection) is to be formed, the above processes are repeated.

However, since the mechanical strength of the low-k layer 3 is lower than that of an $SiO_2$ layer, the low-k layer 3 is structurally damaged by polishing pressure of the CMP. Therefore, peeling disadvantageously occurs in the interface between the cap dielectric layer 4 and the low-k layer 3 or the interface between the low-k layer 3 and the underlying dielectric layer 2. The peeling especially occurs when a low-k material having a low elastic modulus and a low degree of hardness is used and when the adhesive strength between the cap dielectric layer and the low-k layer is low. In particular, it is reported that when the elastic modulus of the low-k layer is 5 GPa or less, peeling easily occurs (for example, refer to Simon Lin et al., "Low-k Dielectric Characterization for Damascene Integration", 2001 IEEE, International Interconnect Technology Conference 2001, pp.146–148). As conventional countermeasures against the peeling, a polishing pressure of CMP is reduced, or a low-k layer having the high elastic modulus and a high degree of hardness is used.

However, when the polishing pressure is reduced as in the conventional technique, the polishing rate decreases to disadvantageously lower the throughput of CMP. Furthermore, when the low-k material having the high elastic modulus and a high degree of hardness is used, the dielectric constant k disadvantageously increases.

SUMMARY OF THE INVENTION

The present invention has been made to solve the above problems, and the object is to provide a method of manufacturing a semiconductor device which can prevent a low-k layer from being peeled by CMP without decreasing a throughput of CMP and increasing the dielectric constant k of the low-k layer.

According to one aspect of the present invention, a first CVD dielectric layer is deposited on a surface of a semiconductor substrate. Next, low-k layers are coated in at least two different steps to form one of a via-layer dielectric film and a wiring-layer dielectric film on the first CVD dielectric layer. Immediately after the coatings, thermal treatment is performed. A second CVD dielectric layer is deposited on the low-k layer. A groove is formed in the second CVD dielectric layer and the low-k layer. A metal layer is deposited on the surface of the resultant structure to bury the groove. The metal layer is removed on the second CVD dielectric layer by chemical mechanical polishing.

Other and further objects, features and advantages of the invention will appear more fully from the following description.

According to the present invention, the low-k layer can be prevented from being peeled by CMP without decreasing the throughput of CMP and increasing the dielectric constant k of the low-k layer.

DETAILED DESCRIPTION OF THE PREFERRED EMBODIMENTS

First Embodiment

Figure 1A:
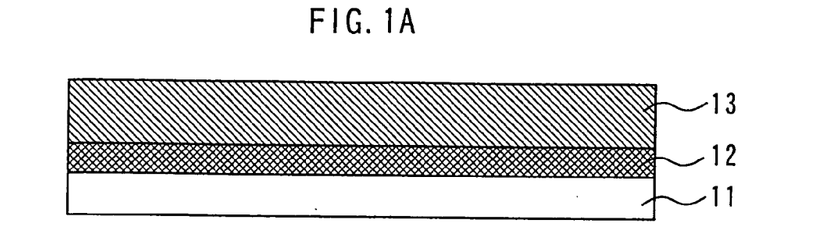
FIGS. 1A–1D and 2 show a method of manufacturing a semiconductor device according to this embodiment.

A method of manufacturing a semiconductor device according to this embodiment will be described below with reference to FIGS. 1A–1D and 2. As shown in FIG. 1A, a first CVD dielectric layer 12 made of an SiC layer having a thickness of 50 nm is formed as an underlying dielectric layer by a CVD method on a semiconductor substrate 11 made of a silicon wafer having a diameter of 300 mm. In this case, as the first CVD dielectric layer 12, an $SiO_2$ layer, an SiCN layer, an SiCO layer, an SiN layer, and the like can also be used. The thickness of the first CVD dielectric layer 12 is preferably within the range of 30 nm to 100 nm. In particular, the thickness is preferably within the range of 30 nm to 70 nm to reduce the effective dielectric constant. An impurity-doped layer may be formed on the semiconductor substrate 11.

Next, on the first CVD dielectric layer 12, a first low-k layer 13 made of MSQ (Methyl Silsesquioxane resin) having a thickness of 250 nm is coated by spin coating. In this case, a rotating speed of a spiner is set at 900 rpm. Immediately after the coating, N-methyl-2-pyrrolidinone ($CH_3NC_4H_6O$) is dropped on the wafer edge to remove the first low-k layer 13 from the wafer edge portion in a width of 5 mm from the edge (not shown). The wafer is placed on a hot plate. The low-k layer 13 is baked as first thermal treatment at 150° C. for 75 seconds in a nitrogen atmosphere and further baked at 250° C. for 75 seconds. Thereafter, the low-k layer 13 is cured at a temperature of 450° C. for 10 minutes in a nitrogen atmosphere.

Figure 1B:
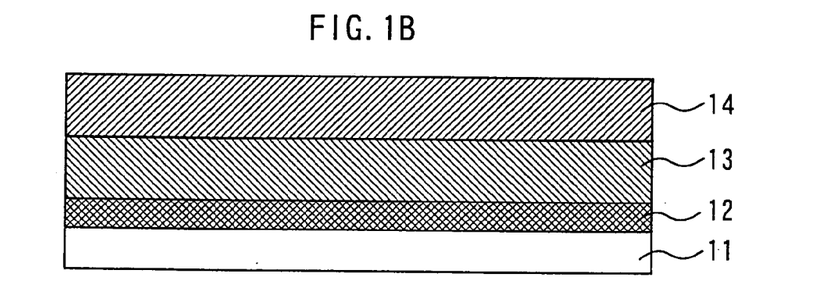

Next, as shown in FIG. 1B, a second low-k layer 14 having a thickness of 250 nm and made of MSQ is similarly coated on the first low-k layer 13 by spin coating. The second low-k layer 14 is removed from the wafer edge portion in a width of 5 mm from the edge (not shown) in the same way as the first low-k layer 13. Immediately after the removal, as second thermal treatment, baking and curing are similarly performed. In this case, the first low-k layer 13 and the second low-k layer 14 are formed by using the same chemical. Each of the densities of the first low-k layer 13 and the second low-k layer 14 is set at 0.7 g/cm$^3$. In addition, composition ratio of each of these layers is given by silicon:oxygen:carbon=30%:53%:17%. The silicon content, the oxygen content, and the carbon content are preferably within the range of 20% to 40%, the range of 40% to 60%, and the range of 10% to 30%, respectively.

As the first low-k layer 13 and the second low-k layer 14, HSQ (hydrogen Silsesquioxane resin), SiOC made by CVD, and a polymer formed by coating may be used.

Next, Helium (He) plasma irradiation is performed in a CVD device to modify the surface of the second low-k layer 14. This is performed to improve the adhesive properties between the second low-k layer 14 and the layer deposited thereon. A gas flow rate is set at 1000 sccm, gas pressure is set at 1000 Pa, high-frequency power is set at 500 W, low-frequency power is set at 400 W, temperature is set at 400° C., and time is set at 15 seconds. As the plasma gas, in addition to He gas, $NH_3$ gas, $N_2O$ gas, $H_2$ gas, $O_2$ gas, $SiH_4$ gas, Ar gas, $N_2$ gas, or the like can be used. However, the helium plasma is especially effective because the low-k layer is less damaged. Furthermore, a gas mixture of these gases may be used. For example, a gas mixture of He gas and the other gases is effectively used.

Figure 1C:
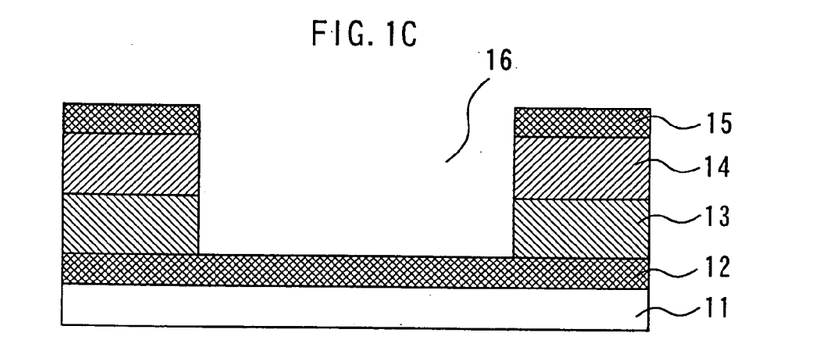

Next, as shown in FIG. 1C, a second CVD dielectric layer 15 having a thickness of 50 nm is deposited on the second low-k layer 14 as a cap dielectric layer by CVD method. In this case, as the CVD dielectric layer 15, one of an $SiO_2$ layer, an SiC layer, an SiCN layer, an SiCO layer, and an SiN layer or a multi layer made of these layers can be used. The thickness of the second CVD dielectric layer 15 is preferably within the range of 30 nm to 200 nm. In particular, the thickness is preferably within the range of 40 nm to 120 nm to reduce the effective dielectric constant.

Next, the second CVD dielectric layer 15, the second low-k layer 14, and the first low-k layer 13 are patterned by photolithography and dry etching to form a groove 16 for forming a damascene wiring layer therein.

Figure 1D:
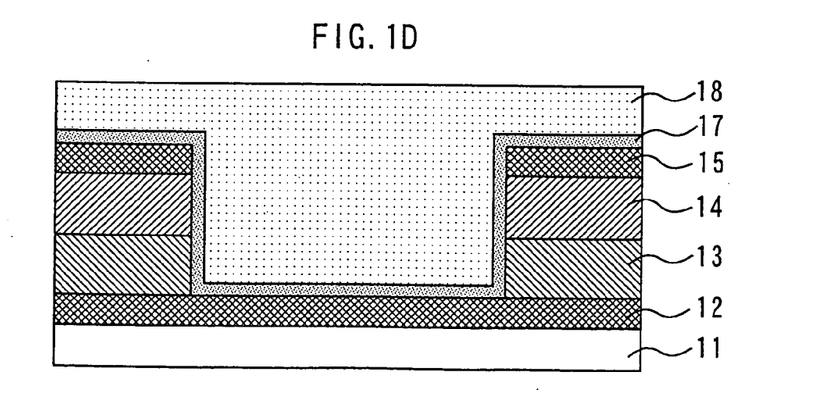

Next, as shown in FIG. 1D, in a sputtering device, a barrier metal layer 17 made of a TaN layer having a thickness of 10 nm, a Ta layer having a thickness of 15 nm, and a Cu seed layer having a thickness of 75 nm is deposited. As the barrier metal layer 17, Ta, TaN, TiN, Ti, WN, WSiN, and the like can be used. In particular, Ta and TaN are preferably used. A bilayer made of a Ta layer and a TaN layer is especially preferably used. A metal layer 18 made of a Cu layer having a thickness of 800 nm is deposited on the surface of the resultant structure by an electroplating method to bury the groove 16. The metal layer 18 is removed from the edge of the wafer (not shown). The removing width is made smaller than the removing width of the low-k layer by 2 mm. Thereafter, an annealing process is performed at 250° C. for 30 minutes.

Finally, the metal layer 18 and the barrier metal layer 17 on the CVD dielectric layer 15 are removed by CMP. As a CMP device, Momentum300 (available from Novellus Systems, Inc.) using an orbital scheme is used. A CMP pressure is set at 1.5 psi, an orbital rotating speed is set at 600 rpm, a head rotating speed is set at 24 rpm, and a slurry supply rate is set at 300 cc/min. As a polishing pad, a single-layer pad (IC1000 available from Rodel, Inc.) made of foamed polyurethane is used. As CMP slurries, an abrasive free slurry (HS-C430-TU available from Hitachi Chemical Co., Ltd.) is used for Cu, and an abrasive slurry (HS-T605 available from Hitachi Chemical Co., Ltd.) is used for TaN. In this polishing, the second CVD dielectric layer 15 may be partially or entirely removed by CMP. With the above steps, a semiconductor device shown in FIG. 2 can be manufactured.

Figure 2:
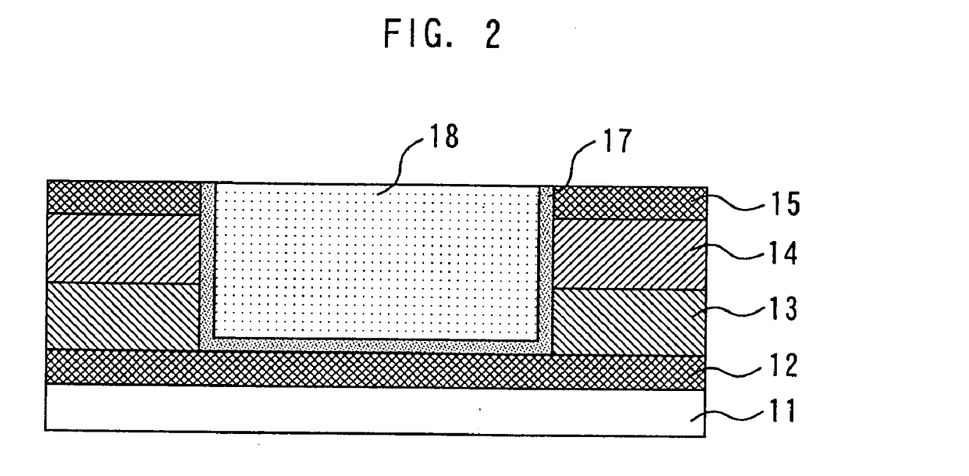
Figure 3:
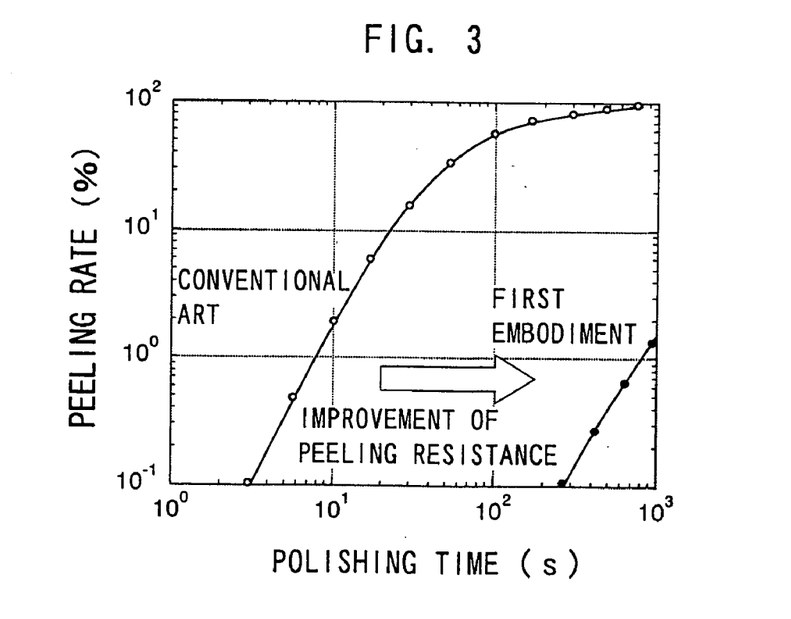
FIG. 3 is a graph showing time of polishing performed by CMP and measurement results of peeling rates of a low-k layer in a wafer plane.

Next, a peeling experiment for a low-k layer performed by CMP will be described below. FIG. 3 is a graph showing time of polishing performed by CMP and measurement results of peeling rates of a low-k layer within a wafer. The measurements are performed with respect to a conventional semiconductor device (corresponding to FIG. 11) in which a low-k layer having a thickness of 500 nm is formed at once and baked and cured only once and a semiconductor device (corresponding to FIG. 2) according to the first embodiment in which in order to obtain a low-k layer having a thickness of 500-nm, two low-k layers each having a thickness of 250-nm are formed, baked and cured in two different steps. Although peeling areas in both the semiconductor devices increase with polishing time, it is found that the resistance to peeling in the semiconductor device according to the first embodiment is considerably higher than that in the conventional semiconductor device.

When the conventional semiconductor device was polished by CMP for 3 minutes under the CMP conditions, it was found that the low-k layer is peeled at a large number of positions in the wafer. For this reason, when the peeling interface was analyzed with a transmission electron microscope (TEM) structural breakdown, i.e., cohesive peeling occurred at a position spaced apart from the interface between the cap dielectric layer and the low-k layer to the low-k layer side by 10 nm to 30 nm. This is because the pores in the low-k layer move to a position near the interface between the low-k layer and the cap dielectric layer.

On the other hand, although the semiconductor device according to the first embodiment was similarly polished for 3 minutes by CMP, any peeling was not detected. In this manner, although the low-k layers coated and formed by the same chemical are used, when low-k layers are deposited, coated, baked and cured in two or more steps, the pores in the porous low-k layer can be prevented from moving to a position near the interface between the low-k layer and the cap dielectric layer, and the resistance to peeling can be improved.

Figure 4:
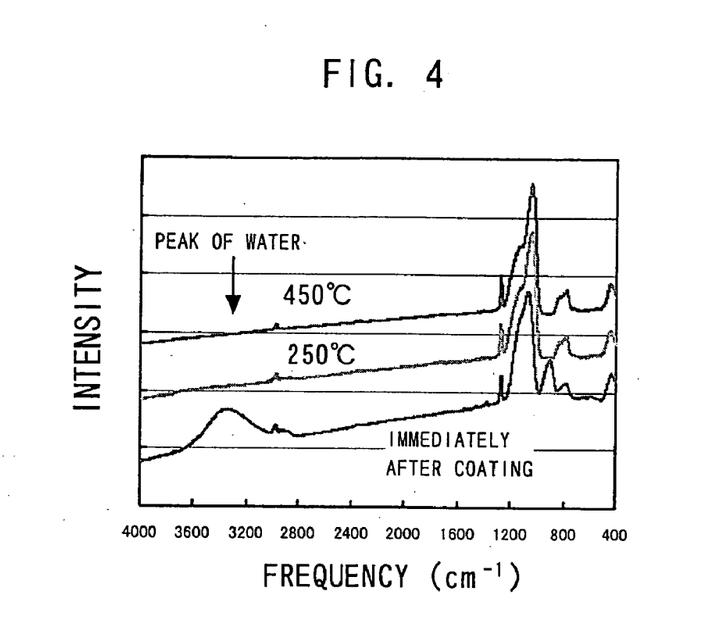
FIG. 4 shows spectra obtained by measuring a low-k layer coated on a substrate with an FTIR (Fourier Transform Infrared Spectroscopy).
Figure 5:
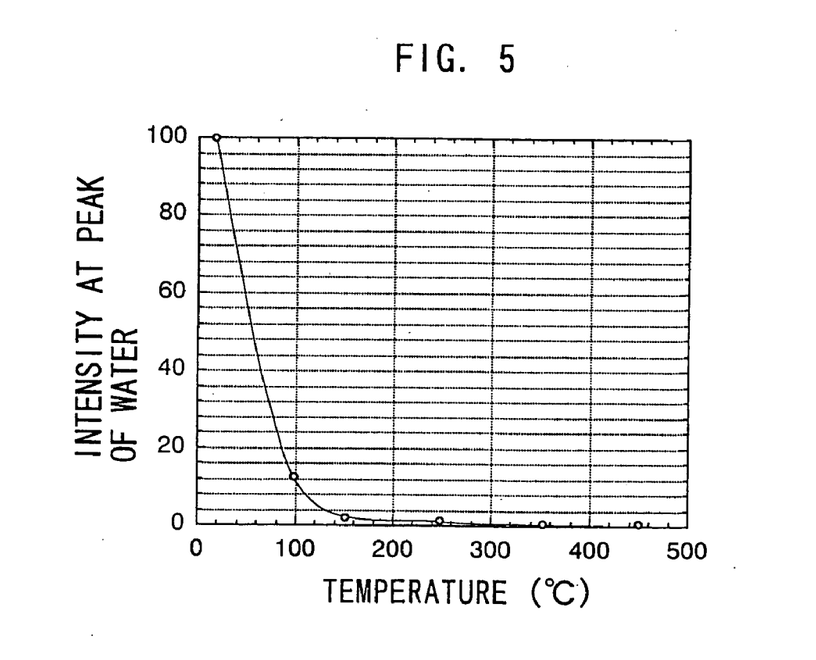
FIG. 5 shows a measurement result of intensity at the peak (3300 cm−1) of the water of the low-k layer with respect to a thermal treatment temperature.

Spectra obtained by measuring a low-k layer coated on a substrate with an FTIR (Fourier Transform Infrared Spectroscopy) are shown in FIG. 4. As is apparent from FIG. 4, water has its peak after the coating. However, it is understood that water has no peak after thermal treatment at 250° C. or 450° C. A measurement result of intensity at the peak (3300 $cm^{-1}$) of the water of the low-k layer with respect to a thermal treatment temperature is shown in FIG. 5. Note that intensity measured at a room temperature immediately, after the coating is set at 100. As is apparent from FIG. 5, when the thermal treatment temperature is set at 100° C. or more, water can be efficiently evaporated from the low-k layer. Because of the thermal resistance of the low-k layer, the thermal treatment temperature must be set at 500° C. or less. Therefore, in the first thermal treatment and the second thermal treatment, the thermal treatment temperature is preferably set at 100° C. or more and 500° C. or less. In this case, thermal treatment time is preferably set at 1 minute or more and 3 hours or less.

Figure 6:
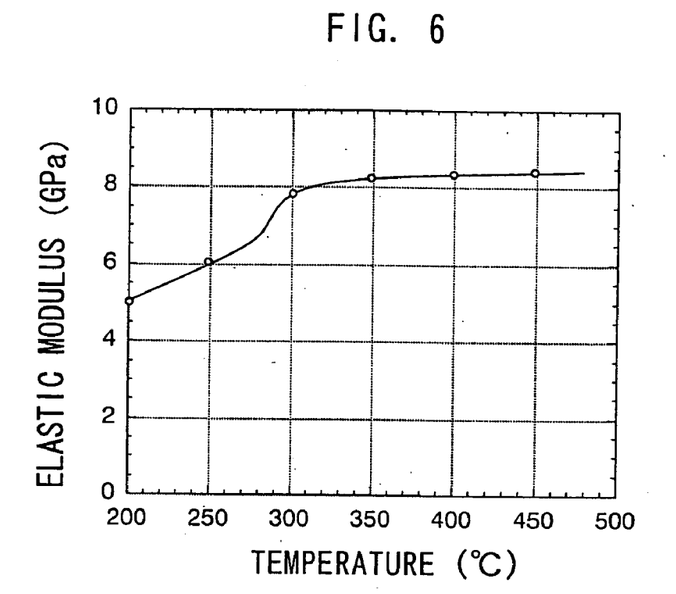
FIG. 6 shows a measurement result of elastic modulus of a low-k layer with respect to a thermal treatment temperature.

A measurement result of elastic modulus of a low-k layer with respect to a thermal treatment temperature is shown in FIG. 6. As is apparent from FIG. 6, the thermal treatment temperature of 300° C. or more can increase the elastic modulus of the low-k layer and can improve adhesive properties. Therefore, in the first thermal treatment and the second thermal treatment, the thermal treatment temperature is preferably set at 300° C. or more and 500° C. or less. In this case, the thermal treatment time is preferably set at 1 minute or more and 3 hours or less.

Figure 7:
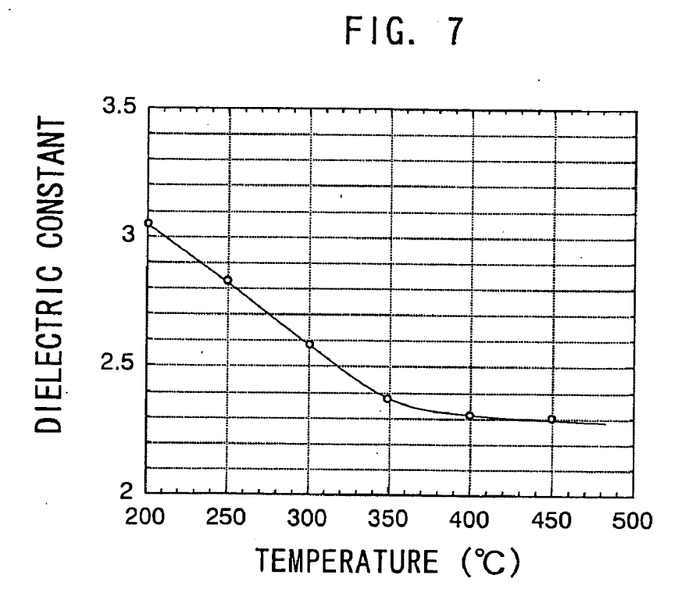
FIG. 7 shows a measurement result of the dielectric constant of a low-k layer with respect to a thermal treatment temperature.

A measurement result of the dielectric constant of a low-k layer with respect to a thermal treatment temperature is shown in FIG. 7. As is apparent from FIG. 7, the thermal treatment temperature of 350° C. or more can reduce the dielectric constant. Therefore, in the first thermal treatment and the second thermal treatment, the thermal treatment temperature is preferably set at 350° C. or more and 500° C. or less. In this case, the thermal treatment time is preferably set at 3 minutes or more and 3 hours or less.

The explanation was made above in the case where low-k layers are coated in two different steps. However, the present invention is not limited to this procedure, low-k layers may be coated in two or more different steps, and thermal treatment may be performed immediately after each coating. Therefore, peeling in the interface between a CVD dielectric layer and a low-k layer caused by CMP can be prevented without decreasing the throughput of CMP and increasing the dielectric constant k of the low-k layer. However, in order to excessively decrease the throughput of manufacturing of semiconductor devices, low-k layers are preferably coated in two or three different steps.

The first embodiment can be applied to not only formation of a wiring-layer dielectric film, but also formation of a via-layer dielectric film. More specifically, the first embodiment can be applied to formation of one of the via-layer dielectric film and the wiring-layer dielectric film.

Figure 8:
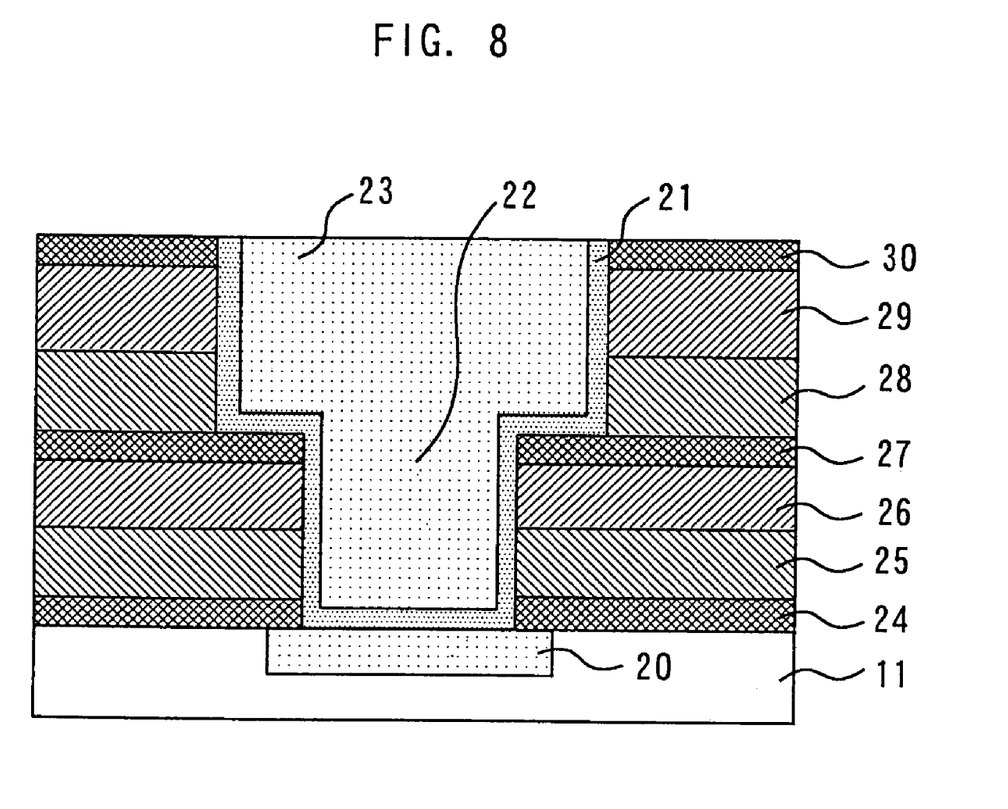
FIG. 8 shows a dual-damascene structure produced by using the present invention.

A dual-damascene structure produced by using the present invention is shown in FIG. 8. A via 22 and an upper wiring layer 23 are connected to an underlying wiring layer 20 formed on the semiconductor substrate 11 through a barrier metal layer 21. As a via-layer dielectric film for the via 22, a CVD dielectric layer 24, low-k layers 25 and 26, and a CVD dielectric layer 27 are formed. As a wiring-layer dielectric film for the upper wiring layer 23, low-k layers 28 and 29 and a CVD dielectric layer 30 are formed. In this manner, in each of the formation of the via-layer dielectric film and the formation of the wiring-layer dielectric film, low-k layers are coated in two or more different steps, and thermal treatment is performed immediately after each coating. More specifically, the present invention can be applied to each of the formation of the via-layer dielectric film and the formation of the wiring-layer dielectric film. The present invention can be applied to only the formation of the wiring-layer dielectric film without being applied to the formation of the via-layer dielectric film.

Second Embodiment

Figure 9:
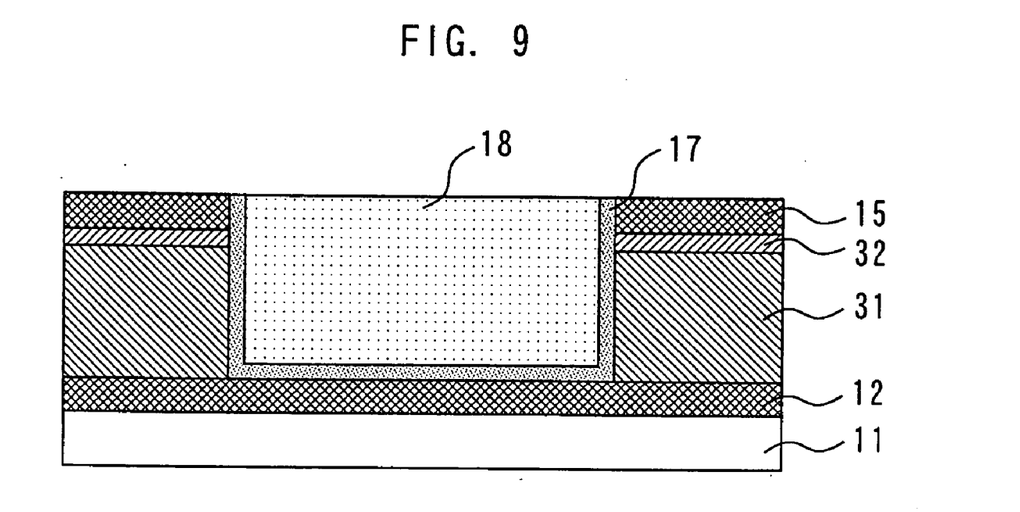
FIG. 9 shows a method of manufacturing a semiconductor device according to the second embodiment of the present invention.

A method of manufacturing a semiconductor device according to the second embodiment of the present invention will be described below with reference to FIG. 9. The same reference numerals as in FIG. 2 denote the same parts in FIG. 9.

A first CVD dielectric layer 12 made of an SiC layer having a thickness of 50 nm is formed as an underlying dielectric layer by a CVD method on a semiconductor substrate 11 made of a silicon wafer having a diameter of 300 mm. In this case, as the first CVD dielectric layer 12, an $SiO_2$ layer, an SiCN layer, an SiCO layer, an SiN layer, and the like can also be used. The thickness of the first CVD dielectric layer 12 is preferably within the range of 30 nm to 100 nm. In particular, the thickness is preferably within the range of 30 nm to 70 nm to reduce the effective dielectric constant. An impurity-doped layer may be formed on the semiconductor substrate 11.

Next, on the first CVD dielectric layer 12, a first low-k layer 31 made of MSQ having a thickness of 250 nm and a density of 0.7 $g/cm^3$ is coated by spin coating. In this case, the thickness of the first low-k layer 31 is preferably within the range of 100 nm to 500 nm. A rotating speed of a spinner is set at 900 rpm. Immediately after the coating N-methyl-2-pyrrolidinone is dropped on the wafer edge to remove the first low-k layer 31 from the wafer edge portion in a width of 5 mm from the edge (not shown). Then, the wafer is placed on a hot plate. The low-k layer 31 is baked as first thermal treatment at 150° C. for 75 seconds in a nitrogen atmosphere and further baked at 250° C. for 75 seconds. Thereafter, the low-k layer 31 is cured at a temperature of 450° C. for 10 minutes in a nitrogen atmosphere.

Next, a second low-k layer 32 made of MSQ having a thickness of 250 nm and a density of 1.7 $g/cm^3$ is similarly coated on the first low-k layer 31 by spin coating. The second low-k layer 32 is removed from the wafer edge portion in a width of 5 mm from the edge (not shown) in the same way as the first low-k layer 31. Immediately after the removal, as second thermal treatment, baking and curing are similarly performed. In this case, the composition of the first low-k layer 31 is almost equal to the composition of the second low-k layer 32. That is, the silicon content, the oxygen content, and the carbon content are preferably within the range of 20% to 40%, the range of 40% to 60%, and the range of 10% to 30%, respectively. The thickness of the second low-k layer 32 is preferably within the range of 1 nm to 200 nm. Because when the thickness is smaller than 1 nm, the effect of prevention of peeling is reduced, and when the thickness exceeds 200 nm, the effective dielectric constant disadvantageously increases. However, the thickness of the second low-k layer 32 is more preferably within the range of 1 nm to 50 nm, and is most preferably within the range of 1 nm to 20 nm. The thickness of the second low-k layer 32 is preferably smaller than the thickness of the first low-k layer 31. When the thickness of the second low-k layer 32 is larger than the thickness of the first low-k layer 31, the effective dielectric constant disadvantageously increases.

As the first low-k layer 31 and the second low-k layer 32, HSQ, an SiOC layer formed by CVD or a polymer formed by coating may be used.

Next, Helium (He) plasma irradiation is performed in a CVD device to modify the surface of the second low-k layer 32. This is performed to improve the adhesive properties between the second low-k layer 32 and the layer deposited thereon. A gas flow rate is set at 1000 sccm, gas pressure is set at 1000 Pa, high-frequency power is set at 500 W, low-frequency power is set at 400 W, temperature is set at 400° C., and time is set at 15 seconds. As the plasma gas, in addition to He gas, $NH_3$ gas, $N_2O$ gas, $H_2$ gas, $O_2$ gas, $SiH_4$ gas, Ar gas, $N_2$ gas, or the like can be used. However, the helium plasma is especially effective because the low-k layer is less damaged. Furthermore, a gas mixture of these gases may be used. For example, a gas mixture of He gas and the other gases is effectively used.

Next, a second CVD dielectric layer 15 having a thickness of 50 nm is deposited on the second low-k layer 32 as a cap dielectric layer by CVD method. In this case, as the second CVD dielectric layer 15, one of an $SiO_2$ layer, an SiC layer, an SiCN layer, an SiCO layer, and an SiN layer or a multi layer made of these layers can be used. The thickness of the second CVD dielectric layer 15 is preferably within the range of 30 nm to 200 nm. In particular, the thickness is preferably within the range of 40 nm to 120 nm to reduce the effective dielectric constant.

Next, the second CVD dielectric layer 15, the second low-k layer 32, and the first low-k layer 31 are patterned by photolithography and dry etching to form a groove for forming a damascene wiring layer therein. In a sputtering device, a barrier metal layer 17 made of a TaN layer having a thickness of 10 nm, a Ta layer having a thickness of 15 nm, and a Cu seed layer having a thickness of 75 nm is deposited. As the barrier metal layer 17, Ta, TaN, TiN, Ti, WN, WSiN, and the like can be used. In particular, Ta and TaN are preferably used. A bilayer made of a Ta layer and a TaN layer is especially preferably used. A metal layer 18 made of a Cu layer having a thickness of 500 nm is deposited on the surface of the resultant structure by an electroplating method to bury the groove. Thereafter, an annealing process is performed at 250° C. for 30 minutes. The metal layer 18 on the wafer edge is removed (not shown). However, the removing width is made smaller than the removing width of the low-k layer by 2 mm.

Finally, the metal layer 18 and the barrier metal layer 17 on the second CVD dielectric layer 15 are removed by CMP. As a CMP device, Momentum300 (available from Novellus Systems, Inc) using an orbital scheme is used. A CMP pressure is set at 1.5 psi, an orbital rotating speed is set at 600 rpm, a head rotating speed is set at 24 rpm, and a slurry supply rate is set at 300 cc/min. As a polishing pad, a single-layer pad (IC1000 available from Rodel, Inc.) made of foamed polyurethane is used. As CMP slurries, an abrasive free slurry (HS-C430-TU available from Hitachi Chemical Co., Ltd.) is used for Cu, and an abrasive slurry (HS-T605 available from Hitachi Chemical Co., Ltd.) is used for TaN. In this polishing, the second CVD dielectric layer 15 may be partially or entirely removed by CMP. With the above steps, a semiconductor device shown in FIG. 9 is manufactured.

Next, a peeling experiment for a low-k layer performed by CMP will be described below. When the conventional semiconductor device (corresponding to FIG. 11) having no second low-k layer 32 was polished by CMP for 3 minutes under the CMP conditions, peeling of the low-k layer was detected in a half area of the wafer. For this reason, when the peeling interface was analyzed with a transmission electron microscope (TEM), structural breakdown, i.e., cohesive peeling occurred at a position spaced apart from the interface between the cap dielectric layer and the low-k layer to the low-k layer side by 10 nm to 30 nm.

On the other hand, although the semiconductor device having the second low-k layer 32 (corresponding to FIG. 9) according to the embodiment is similarly polished for 3 minutes by CMP, any peeling is not detected. This is because the second low-k layer 32 having mechanical strength higher than that of the first low-k layer 31 is formed between the second CVD dielectric layer 15 and the first low-k layer 31 to improve peeling resistance of a portion where peeling easily occurs.

As described above, in order to improve peeling resistance and assure the capability of a low-k layer, as the second low-k layer 32, a low-k layer having the elastic modulus which is 1.2 to 40 times higher than the elastic modulus of the first low-k layer 31 is preferably used. The elastic modulus of the first low-k layer 31 is preferably within the range of 0.3 GPa to 15 GPa, and the elastic modulus of the second low-k layer 32 is within the range of 3 GPa to 30 GPa. When a similar peeling experiment was performed by using the first low-k layer 31 having the elastic modulus of 2 GPa and the second low-k layer 32 having the elastic modulus of 6 GPa, the result showed the same good peeling resistance as the above experimental result.

As the second low-k layer 32, a low-k layer having a degree of hardness which is 1.05 to 1.5 times higher than that of the first low-k layer 31 is preferably used. The degree of hardness of the first low-k layer 31 is preferably within the range of 0.05 GPa to 1.5 GPa, and the degree of hardness of the second low-k layer 32 is preferably within the range of 0.3 GPa to 3 GPa. When a peeling experiment was performed by using the first low-k layer 31 having a degree of hardness of 0.2 GPa and the second low-k layer 32 having a degree of hardness of 0.6 GPa, the result showed the same good peeling resistance as the above experimental result.

As the second low-k layer 32, a low-k layer having a density which is 1.1 to 5 times higher than that of the first low-k layer 31 is preferably used. The density of the first low-k layer 31 is preferably within the range of 0.4 g/cm$^3$ to 1.3 g/cm³, and the density of the second low-k layer 32 is preferably within the range of 0.9 g/cm³ to 2.0 g/cm³.

As the second low-k layer 32, a low-k layer having a porosity lower than that of the first low-k layer 31 is preferably used. The porosity of the first low-k layer 31 is within the range of 10 to 70%, and the porosity of the second low-k layer 32 is preferably within the range of 0 to 40%. In this case, when a peeling experiment was similarly performed by using the first low-k layer 31 having a porosity of 55% and the second low-k layer 32 having a porosity of 26%, the result showed the same good peeling resistance as the above experimental result.

As the second low-k layer 32, a low-k layer having the dielectric constant which is 1.1 to 3 times higher than that of the first low-k layer 31 is preferably used. The dielectric constant of the first low-k layer 31 is preferably within the range of 1.3 to 3.0, and the dielectric constant of the second low-k layer 32 is preferably within the range of 2.5 to 3.5. In this case, when a peeling experiment was similarly performed by using the first low-k layer 31 having the dielectric constant of 1.8 and the second low-k layer 32 having the dielectric constant of 2.6, the result showed the same good peeling resistance as the above experimental result.

As the second low-k layer 32, a low-k layer having a refractive index which is 1.05 to 1.5 times higher than that of the first low-k layer 31 is preferably used. The refractive index of the first low-k layer 31 is preferably within the range of 1.1 to 1.35, and the refractive index of the second low-k layer 32 is preferably within the range of 1.25 to 2.0. In this case, when a peeling experiment was performed by using the first low-k layer 31 having a refractive index of 1.19 and the second low-k layer 32 having a refractive index of 1.29, the result showed the same good peeling resistance as the above experimental result.

As described above, in the method of manufacturing a semiconductor device according to the second embodiment, the second low-k layer 32 having mechanical strength higher than that of the first low-k layer 31 is formed between the first low-k layer 31 and the second CVD dielectric layer. In this manner, peeling of the low-k layer in the CMP step can be prevented without decreasing the throughput of CMP and increasing the dielectric constant k of the low-k layer.

The second embodiment can be applied to not only formation of a wiring-layer dielectric film but also formation of a via-layer dielectric film. More specifically, the second embodiment can be applied to a case in which one of the via-layer dielectric film and the wiring-layer dielectric film is formed.

Third Embodiment

Figure 10:
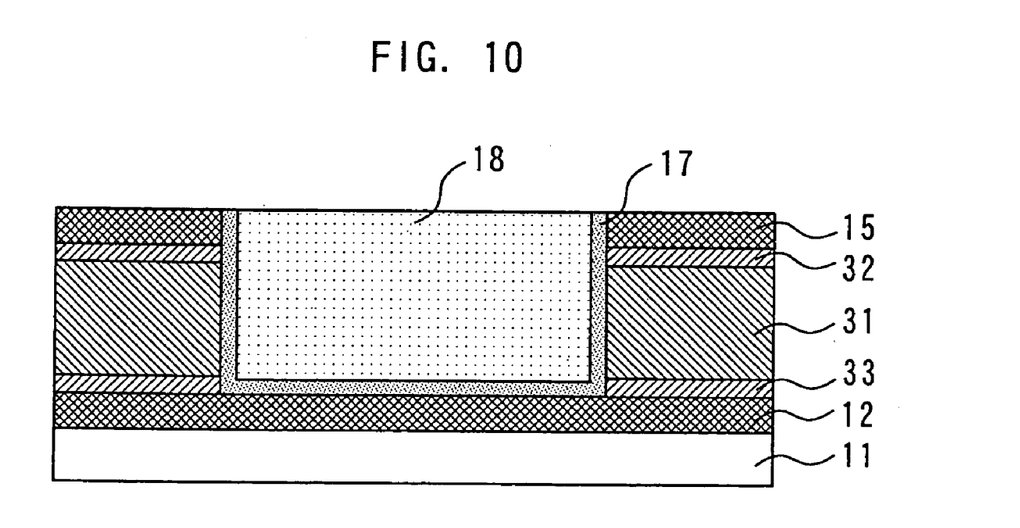
FIG. 10 shows a method of manufacturing a semiconductor device according to the third embodiment of the present invention.

A method of manufacturing a semiconductor device according to the third embodiment of the present invention will be described below with reference to FIG. 10. The same reference numerals as in FIG. 9 denote the same parts in FIG. 10. The third embodiment is different from the second embodiment in that a third low-k layer 33 having mechanical strength higher than that of the first low-k layer 31 is further formed between the first CVD dielectric layer 12 and the first low-k layer 31.

A first CVD dielectric layer 12 having a thickness of 50 nm and made of an SiC layer is formed as an underlying dielectric layer by a CVD method on a semiconductor substrate 11 made of a silicon wafer having a thickness of 300 nm. In this case, as the first CVD dielectric layer 12, an SiO₂ layer, an SiCN layer, an SiCO layer, an SiN layer, or the like can also be used. The thickness of the first CVD dielectric layer 12 is preferably within the range of 30 nm to 100 nm. In particular, the thickness is preferably within the range of 30 to 70 nm to reduce the effective dielectric constant. An impurity-doped layer may be formed on the semiconductor substrate 11.

Next, on the CVD dielectric layer 12, a third low-k layer 33 made of MSQ having a thickness of 50 nm and a density of 1.1 g/cm³ is coated by spin coating. A rotating speed of a spiner is set at 900 rpm. Immediately after the coating, N-methyl-2-pyrrolidinone is dropped on the wafer edge to remove the third low-k layer 33 from the wafer edge portion in a width of 5 mm from the edge (not shown). The wafer is placed on a hot plate. The low-k layer 33 is baked as first thermal treatment at 150° C. for 75 seconds in a nitrogen atmosphere and further baked at 250° C. for 75 seconds. Thereafter, the low-k layer 33 is cured at a temperature of 450° C. for 10 minutes in a nitrogen atmosphere.

On the resultant structure, a first low-k layer 31 made of MSQ having a thickness of 250 nm and a density of 0.7 g/cm³ is coated by spin coating. The first low-k layer 31 is removed from the wafer edge portion in a width of 5 mm from the edge (not shown) in the same way as the third low-k layer 33. Immediately after the removal, as second thermal treatment, baking and curing are performed similarly to the first thermal treatment. In this case, the thickness of the first low-k layer 31 is preferably within the range of 100 nm to 500 nm. In addition, on the first low-k layer 31, a second low-k layer 32 made of MSQ having a thickness of 50 nm and a density of 1.7 g/cm³ is similarly coated by spin coating. The second low-k layer 32 is removed in a width of 5 mm from the wafer edge (not shown) in the same way as the third low-k layer 33. Immediately after the removal, as third thermal treatment, baking and curing are performed similarly to the first and second thermal treatments.

In this case, each of the thicknesses of the third low-k layer 33 and the second low-k layer 32 is preferably within the range of 1 nm to 200 nm. When the thicknesses are smaller than 1 nm, the effect of prevention of peeling is reduced. When the thicknesses exceed 200 nm, the effective dielectric constant disadvantageously increases. However, the thicknesses of the third low-k layer 33 and the second low-k layer 32 are more preferably within the range of 1 nm to 50 nm, and are most preferably within the range of 1 nm to 20 nm. The composition ratios of the third low-k layer 33, the first low-k layer 31, and the second low-k layer 32 are almost equal to each other. The silicon content, the oxygen content, and the carbon content of each of the low-k layers are preferably within the range of 20% to 40%, the range of 40% to 60%, and the range of 10% to 30%, respectively.

As the third low-k layer 33, the first low-k layer 31, and the second low-k layer 32, HSQ, an SiOC layer formed by CVD or a polymer formed by coating may be used.

Next, Helium (He) plasma irradiation is performed in a CVD device to modify the surface of the second low-k layer 32. This is performed to improve the adhesive properties between the second low-k layer 32 and the layer deposited thereon. In this case, a gas flow rate is set at 1000 sccm, gas pressure is set at 1000 Pa, high-frequency power is set at 500 W, low-frequency power is set at 400 W, temperature is set at 400° C., and time is set at 15 seconds. As the plasma gas, in addition to He gas, NH₃ gas, N₂O gas, H₂ gas, O₂ gas, SiH₄ gas, Ar gas, N₂ gas, or the like can be used. However, the helium plasma is especially effective because the low-k layer is less damaged. Furthermore, a gas mixture of these gases may be used. For example, a gas mixture of He gas and the other gases is effectively used.

Next, a second CVD dielectric layer 15 having a thickness of 50 nm is deposited on the second low-k layer 32 as a cap dielectric layer by CVD method. In this case, as the second CVD dielectric layer 15, one of an $SiO_2$ layer, an SiC layer, an SiCN layer, an SiCO layer, and an SiN layer or a multi layer made of these layers can be used. The thickness of the second CVD dielectric layer 15 is preferably within the range of 30 nm to 200 nm. In particular, the thickness is is preferably within the range of 40 nm to 120 nm to reduce the effective dielectric constant.

Next, the second CVD dielectric layer 15, the second low-k layer 32, the first low-k layer 31, and the third low-k layer 33 are patterned by photolithography and dry etching to form a groove for forming a damascene wiring layer therein. In a sputtering device, a barrier metal layer 17 made of a TaN layer having a thickness of 10 nm, a Ta layer having a thickness of 15 nm, and a Cu seed layer having a thickness of 75 nm is deposited. As the barrier metal layer 17, Ta, TaN, TiN, Ti, WN, WSiN, and the like can be used. In particular, Ta and TaN are preferably used. A bilayer made of a Ta layer and a TaN layer is especially preferably used. A metal layer 18 made of a Cu layer having a thickness of 500 nm is deposited on the surface of the resultant structure by an electroplating method to bury the groove. The metal layer 18 on the wafer edge portion is removed (not shown). However, the removing width is made smaller than the removing width of the low-k layer by 2 mm. Thereafter, an annealing process is performed at 250° C. for 30 minutes.

Finally, the metal layer 18 and the barrier metal layer 17 on the second CVD dielectric layer 15 are removed by CMP. As a CMP device, Momentum300 (available from Novellus Systems, Inc) using an orbital scheme is used. A CMP pressure is set at 1.5 psi, an orbital rotating speed is set at 600 rpm, a head rotating speed is set at 24 rpm, and a slurry supply rate is set at 300 cc/min. As a polishing pad, a single-layer pad (IC1000 available from Rodel, Inc.) made of foamed polyurethane is used. As CMP slurries, an abrasive free slurry (HS-C430-TU available from Hitachi Chemical Co., Ltd.) is used for Cu, and an abrasive slurry (HS-T605 available from Hitachi Chemical Co., Ltd.) is used for TaN. In this polishing, the second CVD dielectric layer 15 may be partially or entirely removed by CMP. With the above steps, a semiconductor device shown in FIG. 10 is manufactured.

Next, with respect to the semiconductor device according to the embodiment (corresponding to FIG. 10), a peeling experiment for a low-k layer was performed in the same manner as that of the second embodiment. When the semiconductor device according to the third embodiment was polished by CMP for 3 minutes, as in the semiconductor device according to the second embodiment, any peeling was not detected.

Next, the semiconductor device according to the third embodiment is polished by CMP for 10 minutes, slight peeling was detected at the wafer edge. For this reason, when the peeling interface was analyzed with a TEM, cohesive peeling occurred at a position spaced apart from the interface between the first CVD dielectric layer 12 and the first low-k layer 31 to the first low-k layer 31 side by 10 nm to 30 nm. On the other hand, in the semiconductor device according to the third embodiment, any peeling of the low-k layer was not detected. This is because the third low-k layer 33 having high mechanical strength is formed between the first CVD dielectric layer 12 and the first low-k layer 31 to further improve peeling resistance at a portion where peeling easily occurs.

As described above, in order to improve peeling resistance and assure the capability of a low-k layer, as the third low-k layer 33 and the second low-k layer 32, low-k layers each having the elastic modulus which is 1.2 to 40 times higher than the elastic modulus of the first low-k layer 31 are preferably used. The elastic modulus of the first low-k layer 31 is preferably within the range of 0.3 GPa to 15 GPa, and the elastic modulus of the third low-k layer 33 and the second low-k layer 32 is preferably within the range of 3 GPa to 30 GPa. When a similar peeling experiment was performed by using the first low-k layer 31 having the elastic modulus of 2 GPa and the third and second low-k layers 33 and 32 each having the elastic modulus of 6 GPa, the result showed the same good peeling resistance as the above experimental result.

As the third low-k layer 33 and the second low-k layer 32, low-k layers each having a degree of hardness which is 1.05 to 1.5 times higher than that of the first low-k layer 31 are preferably used. The degree of hardness of the first low-k layer 31 is preferably within the range of 0.05 GPa to 1.5 GPa, and the degrees of hardness of the third low-k layer 33 and the second low-k layer 32 are preferably within the range of 0.3 GPa to 3 GPa. When a peeling experiment was performed by using the first low-k layer 31 having a degree of hardness of 0.2 GPa and the third and second low-k layers 33 and 32 each having a degree of hardness of 0.6 GPa, the result showed the same good peeling resistance as the above experimental result.

As the third and second low-k layers 33 and 32, a low-k layer having a density which is 1.1 to 5 times higher than that of the first low-k layer 31 is preferably used. The density of the first low-k layer 31 is preferably within the range of 0.4 g/cm$^3$ to 1.3 g/cm$^3$, and the densities of the third low-k layer 33 and the second low-k layer 32 are preferably within the range of 0.9 cm$^3$ to 2.0 g/cm$^3$.

As the third low-k layer 33 and the second low-k layer 32, low-k layers each having a porosity lower than that of the first low-k layer 31 are preferably used. The porosity of the first low-k layer 31 is within the range of 10 to 70%, and the porosities of the third low-k layer 33 and the second low-k layer 32 are preferably within the range of 0 to 40%. In this case, when a peeling experiment was similarly performed by using the first low-k layer 31 having a porosity of 55% and the third and second low-k layers 33 and 32 each having a porosity of 26%, the result showed the same good peeling resistance as the above experimental result.

As the third low-k layer 33 and the second low-k layer 32, low-k layers each having the dielectric constant which is 1.1 to 3 times higher than that of the first low-k layer 31 are preferably used. The dielectric constant of the first low-k layer 31 is preferably within the range of 1.3 to 3.0, and the dielectric constants of the third and second low-k layers 33 and 32 are preferably within the range of 2.5 to 3.5. In this case, when a peeling experiment was similarly performed by using the first low-k layer 31 having the dielectric constant of 1.8 and the third and second low-k layers 33 and 32 each having the dielectric constant of 2.6, the result showed the same good peeling resistance as the above experimental result.

As the third low-k layer 33 and the second low-k layer 32, low-k layers each having a refractive index which is 1.05 to 1.5 times higher than that of the first low-k layer 31 are preferably used. The refractive index of the first low-k layer 31 is preferably within the range of 1.1 to 1.35, and the refractive indexes of the third low-k layer 33 and the second low-k layer 32 are preferably within the range of 1.25 to 2.0. In this case, when a peeling experiment was similarly performed by using the first low-k layer 31 having a refractive index of 1.19 and the third and second low-k layers 33 and 32 each having a refractive index of 1.29, the result showed the same good peeling resistance as the above experimental result.

As described above, in the method of manufacturing a semiconductor device according to the third embodiment, the third low-k layer 33 is formed between the first low-k layer 31 and the first CVD dielectric layer, and the second low-k layer 32 is formed between the first low-k layer 31 and the second CVD dielectric layer. As the third low-k layer 33 and the second low-k layer 32, low-k layers having mechanical strength higher than that of the first low-k layer 31 are used. In this manner, peeling of a low-k layer in the CMP step can be prevented more securely than that in the second embodiment.

The third embodiment can be applied to not only formation of a wiring-layer dielectric film but also formation of a via-layer dielectric film. More specifically, the third embodiment can be applied to a case in which one of the via-layer dielectric film and the wiring-layer dielectric film is formed.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2003-326559, filed on Sep. 18, 2003 and a Japanese Patent Application No. 2003-326560, filed on Sep. 18, 2003, including specification, claims, drawings and summary, on which the Convention priority of the present application is based, are incorporated herein by reference in its entirety.

What is claimed is:

1. A method of manufacturing a semiconductor device comprising:
    depositing a first CVD dielectric layer on a surface of a semiconductor substrate;
    depositing a first low-k layer on the first CVD dielectric layer from source materials and, immediately after depositing the first low-k layer, thermally treating the first low-k layer;
    depositing a second low-k layer on the first low-k layer from the same source materials used to deposit the first low-k layer and, immediately after depositing the second low-k layer, thermally treating the second low-k layer;
    depositing a second CVD dielectric layer on the second low-k layer;
    forming a groove in the second CVD dielectric layer, the second low-k layer, and the first low-k layer;
    depositing a metal layer on the second CVD dielectric layer and filling the groove; and
    removing the metal layer from the second CVD dielectric layer by chemical mechanical polishing.

2. The method of manufacturing a semiconductor device according to claim 1, including thermally treating the first and second low-k layers at temperatures of at least 100° C. and no more than 500° C.

3. The method of manufacturing a semiconductor device according to claim 1, including using a methyl silsesquioxane resin as the first and second low-k layers.

4. The method of manufacturing a semiconductor device according to claim 1, as including depositing as the first and second low-k layers, low-k layers having a composition ratio of silicon:oxygen:carbon=20% to 40%:40% to 60%:10% to 30%.

5. The method of manufacturing a semiconductor device according to claim 1, further comprising plasma treating after depositing the second low-k layer.

6. The method of manufacturing a semiconductor device according to claim 1, wherein the metal layer is a wiring layer and the first and second low-k layers are wiring dielectric films at a side of the wiring layer, on the substrate.

7. The method of manufacturing a semiconductor device according to claim 1, including depositing the first and second low-k layers by spin coating.

8. The method of manufacturing a semiconductor device according to claim 1, including thermally treating the first and second low-k layers in a nitrogen ambient.

9. The method of manufacturing a semiconductor device according to claim 1, wherein thermally treating both of the first and second low-k layers includes thermally treating each of the first and second low-k layers at each of two different temperatures.

* * * * *